United States Patent [19]

Fuse

[11] Patent Number: 5,013,673
[45] Date of Patent: May 7, 1991

[54] IMPLANTATION METHOD FOR UNIFORM TRENCH SIDEWALL DOPING BY SCANNING VELOCITY CORRECTION

[75] Inventor: Genshu Fuse, Osaka, Japan

[73] Assignee: Matsushita Electric Industrial Co., Ltd., Japan

[21] Appl. No.: 543,311

[22] Filed: Jun. 26, 1990

[30] Foreign Application Priority Data

Jun. 30, 1989 [JP] Japan ................................ 1-170114

[51] Int. Cl.$^5$ ........................................ H01L 21/265
[52] U.S. Cl. ...................................... 437/38; 437/16; 437/35; 437/80; 437/52; 437/919; 357/23.6
[58] Field of Search ...................... 437/16, 35, 38, 80, 437/52, 919; 357/23.6

[56] References Cited

U.S. PATENT DOCUMENTS

| | | | |
|---|---|---|---|
| 3,908,262 | 9/1975 | Stein | 437/35 |
| 3,914,857 | 10/1975 | Goser | 437/35 |
| 4,437,226 | 3/1984 | Soclof | 437/35 |
| 4,525,919 | 7/1985 | Fabian | 437/80 |
| 4,756,793 | 7/1988 | Peek | 437/35 |
| 4,824,793 | 4/1989 | Richardson et al. | 437/919 |
| 4,918,027 | 4/1990 | Fuse | 437/35 |
| 4,921,815 | 5/1990 | Miyazawa | 437/52 |

FOREIGN PATENT DOCUMENTS

| | | | |
|---|---|---|---|
| 0072585 | 6/1977 | Japan | 437/35 |
| 0068073 | 1/1983 | Japan | 437/38 |
| 0274621 | 11/1987 | Japan | 437/16 |
| 0021919 | 1/1989 | Japan | 437/16 |
| 0034939 | 2/1990 | Japan | 437/35 |

OTHER PUBLICATIONS

Kaim, Robert E., "Improved VLSI Device Yields Through Control of Implant Angle", 2/90, Solid State Technology, p. 103.

"Beam Scanning System for Large Tilt Angle Ion Implantation" by M. Sasaki et al.; Nuclear Instruments and Methods in Physics Research B37/38 (1989), 469-471; North-Holland, Amsterdam.

"A New Isolation Method with Boron-Implanted Sidewalls for Controlling Narrow-Width Effect" by G. Fuse et al.; IEEE Transactions on Electron Devices, vol. ED-34, No. 2, Part 1, Feb. 1987.

Primary Examiner—Brian E. Hearn
Assistant Examiner—Gordon V. Hugo
Attorney, Agent, or Firm—Lowe, Price, LeBlanc, Becker & Shur

[57] ABSTRACT

An ion implantation method comprising doping a trench sidewall formed in the surface of a semiconductor substrate, with impurities by intermittently rotating step ion implantation carried out in the state that said sidewall is angled with respect to an ion beam, wherein; the amount of ion implantation to said sidewall is made uniform by varying the scanning velocity of the ion beam on the surface of said semiconductor substrate, at the position near to, and the position distant from, the upstream side of the beam applied to a position at which said surface of semiconductor substrate is inclined with respect to the beam.

Also disclosed is a method of manufacturing a semiconductor device making use of such an ion implantation method.

9 Claims, 5 Drawing Sheets

IMPLANTATION METHOD FOR UNIFORM TRENCH SIDEWALL DOPING BY SCANNING VELOCITY CORRECTION

BACKGROUND OF THE INVENTION

1. Field of the Invention

This invention relates to an ion implantation method that can improve a uniformity of doping to trench sidewalls of a semiconductor substrate having a trench structure, and a method of manufacturing a semiconductor device making use of the implantation method.

2. Description of the Prior Art

In conventional ion implantation to a trench structure, trench sidewalls that face in various directions are uniformly doped with impurities by a method in which an ion beam scans the surface of a wafer and the wafer is continuously rotated in the state that the beam is inclined with respect to the direction of a perpendicular line of the wafer, or a method in which a wafer is stepwise rotated in intermittently rotating step ion implantation. In these methods, however, a problem may arise, which is a problem of an error in angles. On the latter method, the present inventor and his colleagues have made a report in IEEE Transaction on Electron Devices, Vol. ED-34, No. 2, p. 356, 1987.

The error in angles in the conventional ion implantation to a trench structure will be explained below with reference to FIG. 7. In an ion implantation apparatus, scanning is electrostatically carried out through a scanning electrode 7 provided at a certain point on the beam line as shown in FIG. 7, and hence a delicate distribution of implantation angles is produced on the angles in a wafer 1. This results in a loss of uniformity of doping to the trench sidewalls. In ordinary ion implantation apparatus presently available, the error is produced at an angle of about ±3°. This angle, when, for example, ions are implanted at an angle of 7°, brings about a difference of from 4° to 10° in implantation angles from one end to the other end of the wafer. Hence, the amount of implantation may greatly differ at sidewalls, depending on the scanning positions on the wafer.

In conventional ion implantation methods, when the implantation angle is set at 7° at the central part and a sidewall 3 and a sidewall 5 of each trench 2 in a substrate 1 are set at 4° and 10°, respectively, with respect to the surface of the substrate, the amount of implantation to sidewalls, dependent upon angles, can be calculated to find that ions are implanted in a larger amount of simply as many as about 1.42 times to the sidewall having an angle of 10° with respect to the sidewall of a trench at the central part. At the sidewall having an angle of 4°, it follows that ions are implanted in an amount of 0.57 time.

On the other hand, an apparatus in which the scanning velocity of an ion beam can be varied depending on the position at which the beam scans the surface has been made commercially available for the purpose of enhancing the uniformity of doping. This is reported in M. Sasaki et al, Nuclear Instrument and Method in Physics Research B37/38 (1989) p. 469. This method, however, is a method in which a non-uniform beam density over the whole wafer because of the spread of a beam is corrected. The method can be effective for making uniform the doping to the whole surface of the wafer, but may more worsen the uniformity of doping to the sidewalls of a trench, which are highly sensitively affected by angles.

It is also attempted to provide a method in which a wafer is irradiated with a perfectly parallel beam. This method, however, requires a complicated structure for its apparatus, resulting in a very high price of the apparatus. Process cost increases accordingly. In addition, even if a parallel beam can be produced, there is a limit to its accuracy, and it is very difficult to give an angle of ±1° or less.

SUMMARY OF THE INVENTION

The present invention was made taking account of the above problems. Accordingly, an object of the present invention is to provide an ion implantation method by which trench sidewalls can be uniformly doped with ions over the whole surface of a wafer.

In order to solve the problems discussed above, the present invention provides an ion implantation method in which, when ions are implanted to a trench structure by the use of an ion implantation apparatus having an error in implantation angles, an ion beam is made to scan the wafer surface at a velocity variable depending on the scanning positions on the wafer, so that the trench sidewalls in the surface of the wafer can be doped with ions in substantially the same amount.

More specifically, the present invention provides an ion implantation method comprising doping a trench sidewall formed in the surface of a semiconductor substrate, with impurites by intermittently rotating step ion implantation carried out in the state that said sidewall is angled with respect to an ion beam, wherein; the amount of ion implantation to said sidewall is made uniform by varying the scanning velocity of the ion beam on the surface of said semiconductor substrate, at the position near to, and the position distant from, the upstream side of the beam applied to a position at which said surface of semiconductor substrate is inclined with respect to the beam.

The present invention also provides a method of manufacturing a semiconductor device making use of such an ion implantation method.

The present invention having the above constitution enables improvement in the uniformity of doping density in trench sidewalls formed in the surface of a wafer, because of the variations of ion beam scanning velocity, depending on the scanning positions on the wafer.

DESCRIPTION OF THE PREFERRED EMBODIMENTS

Figure 1:
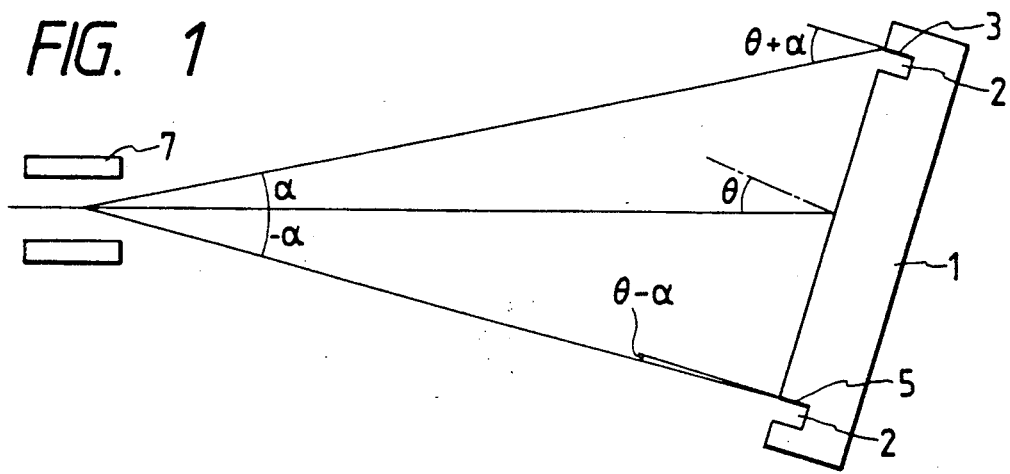
FIG. 1 schematically illustrates the relationship between an implantation angle and an ion beam in an embodiment of the present invention.

FIG. 1 schematically illustrates the relationship between an implantation angle and an ion beam in an embodiment of the present invention.

Figure 2:
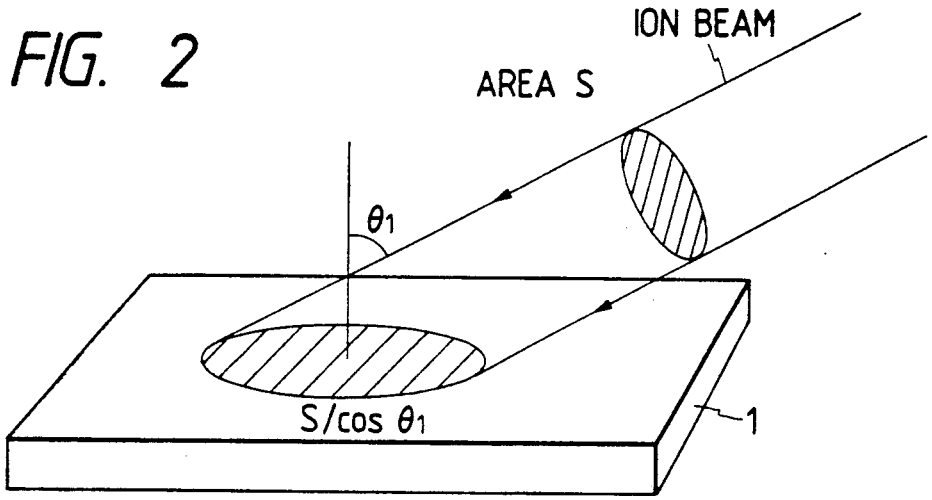
FIG. 2 schematically illustrates the relationship between the amount of ion implantation and the surface density.

In FIG. 1, trenches 2 are formed in a semiconductor substrate (for example, a silicon substrate). The semiconductor substrate 1 is so disposed that a normal of its surface is at a tilt angle $\theta$ with respect to an ion beam at the center. Ions are implanted in an angle error $\alpha$ produced when a beam scans a wafer at a tilt angle $\theta$. Ions are implanted to an upper side wall 3 of an upper trench of the trenches and an upper sidewall 5 of a lower sidewall of the trenches, where the angle, i.e., implantation angle, taken from the direction of a normal of the sidewall 3 comes to be $90°-(\theta+\alpha)$. With respect to the sidewall 5, ions are implanted at an implantation angle of $90°-(\theta-\alpha)$. Here, the amount of implantation changes depending on the implantation angle. This will be described with reference to FIG. 2. When an ion beam with an area S is made incident on the substrate 1 at an implantation angle of $\theta_1$, the area at which the substate is irradiated with the ion beam is $S/\cos\theta$. The dose of implantation, which indicates the amount of ions per unit area, is a dose obtained by multiplying $\cos\theta_1$. Namely, the amount of implantation changes simply in a ratio of $\sin(\theta+\alpha)/\sin\theta$ in respect of the trench sidewall, relative to the amount of implantation at the position of the angle $\theta$. Now, the velocity at which the ion beam scans the surface may be varied on the basis of the reciprocal of this ratio, so that it becomes possible to carry out doping in a uniform plane density for all the sidewalls in the surface.

Figure 3:
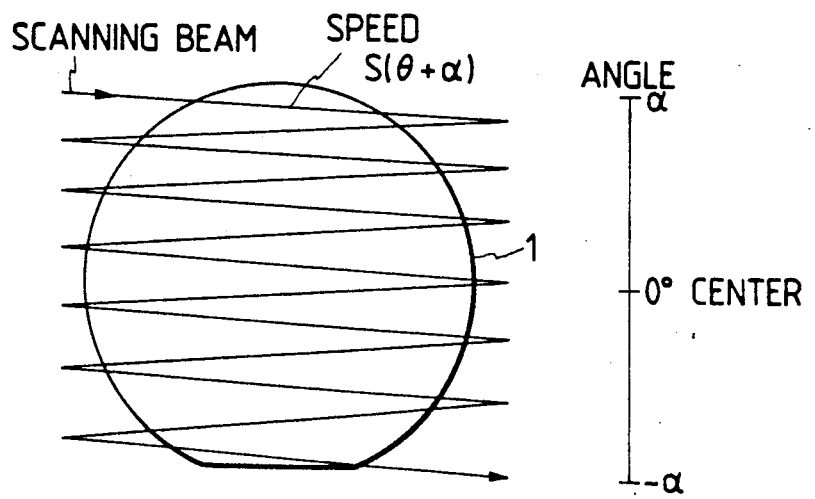
FIG. 3 schematically illustrates an instance in which a beam scans the surface of a wafer.
Figure 4:
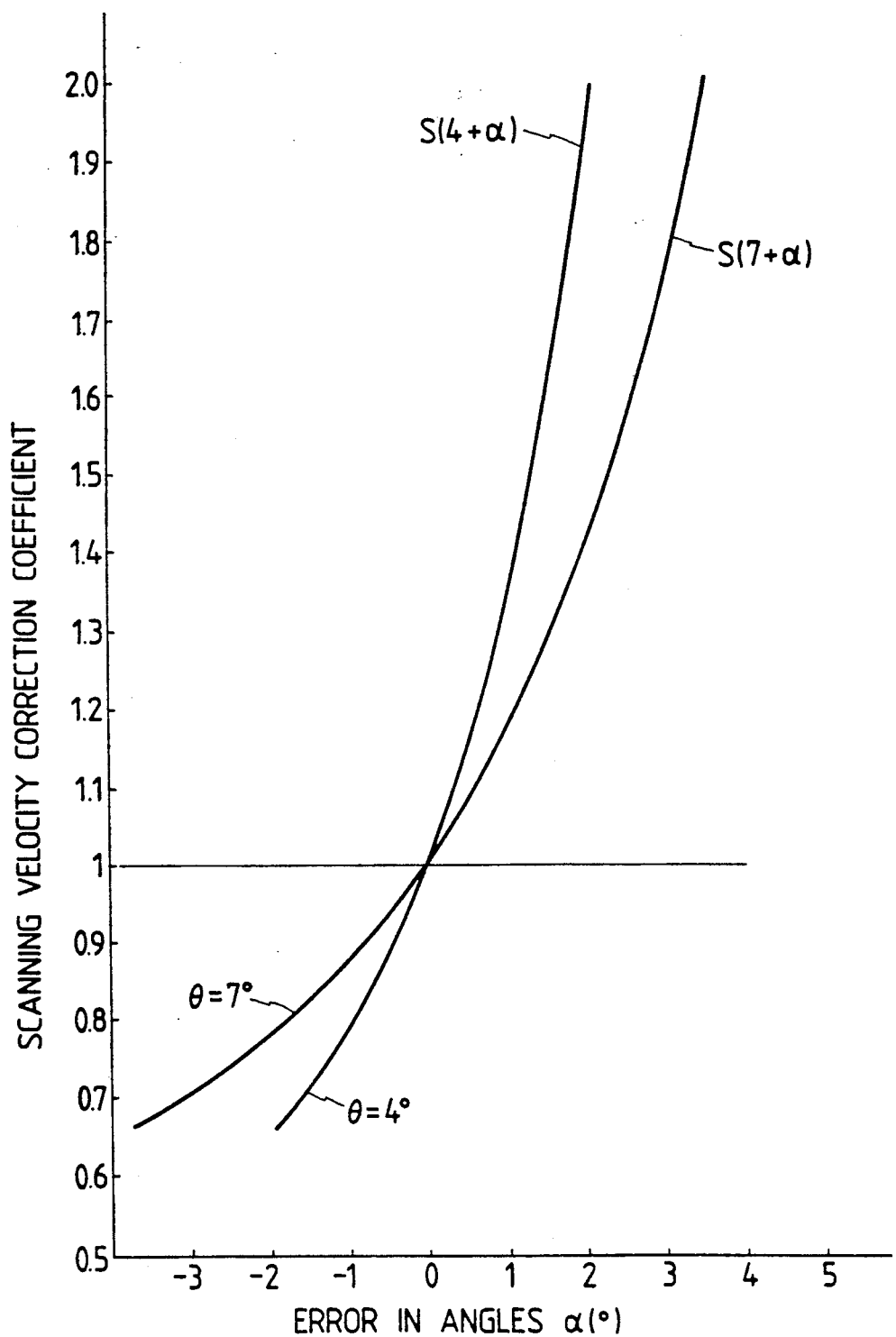
FIG. 4 shows the relationship between the implantation angle and correction coefficient of scanning velocity on a wafer.

FIG. 3 illustrates how a beam scans the surface of a wafer. In FIG. 3, the velocity at the upper part is varied at $S(\theta+\alpha)$ in accordance with an angle $\alpha$. In FIG. 4, the relationship between this angle $\alpha$ and a correction coefficient of the scanning velocity $S(\theta+\alpha)$ is shown in instances in which ions are implanted at implantation angles of 7° and 4° (values of $\theta$). This correction of implantation can be accomplished by a method in which the triangular wave for the scanning at the time beam scanning is electrostatically carried out as in the scanning process shown in FIG. 3 is varied in accordance with the amounts of correction at the angles shown in FIG. 4.

Figure 5:
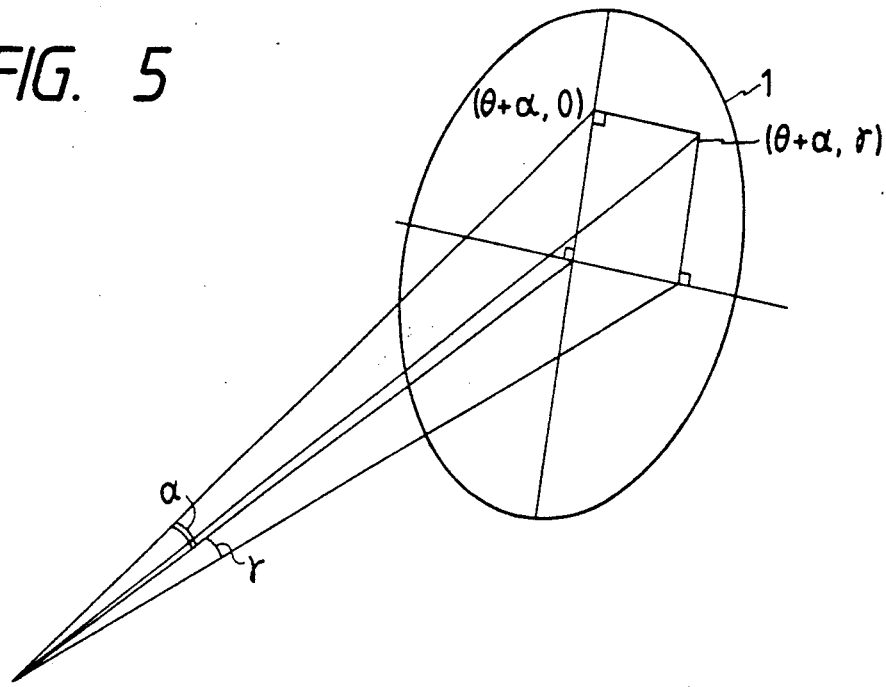
FIG. 5 schematically illustrates an angle error.

When ions are implanted closely in parallel to the surface a trench sidewall, there is a phenomenon in which ions are reflected from the surface to lower the amount of implantation. The correction based on this reflection may be added, so that it becomes possible to carry out more accurate ion implantation. The correction of scanning velocity may also be carried out in combination, against the error in the amount of implantation with respect to a delicate spread of an implantation angle, so that the accuracy of implantation can be further improved. More specifically, as will be described with reference to FIG. 5, when ions are implanted at the position with angles as shown in FIG. 5 in which a substrate a is so disposed that a normal of its surface is at a tilt angle $\theta$ with respect to an ion beam, a correction coefficient is determined by making correction on the basis of a velocity obtained by multiplying the three factors: a scanning velocity correction coefficient $g(\theta+\alpha)$ based on reflection, a scanning velocity correction coefficient $S(\theta+\alpha)$ for side walls, based on angles, and a scanning velocity correction coefficient $f(\theta+\alpha,\gamma)$ based on beam spread.

Figure 6:
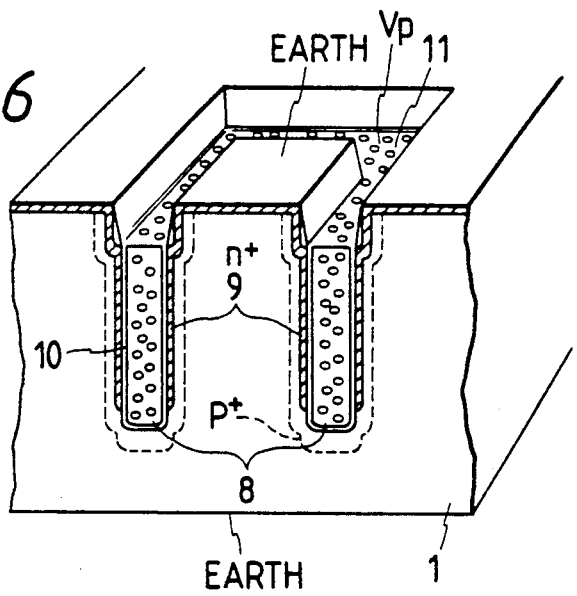
FIG. 6 is a perspective view to illustrate a structure of a trench capacitor.
Figure 7:
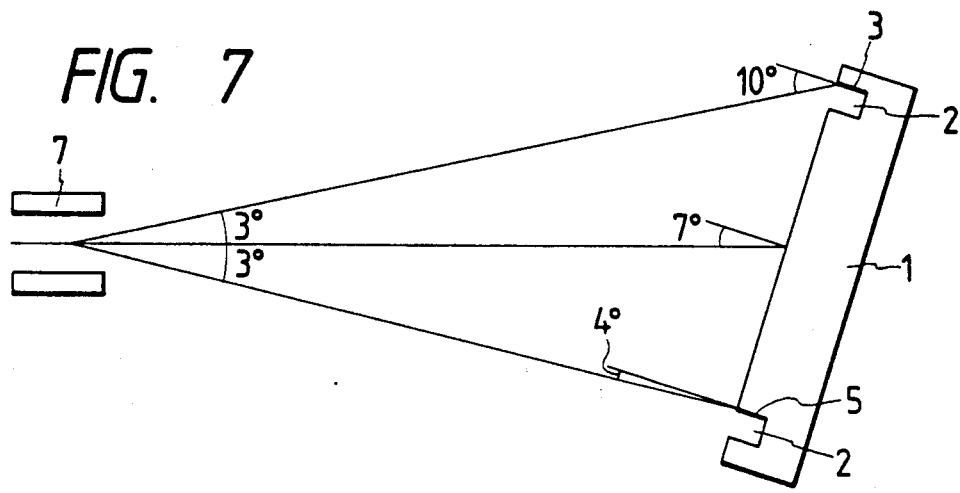
FIG. 7 illustrates an angle error in an instance in which ions are implanted at an angle of 7° and the angle error is 3°.

FIG. 6 illustrates a structure of a trench capacitor used in a dynamic RAM manufactured using the present invention. Trenches 8 are formed in a p-substrate 1, and arsenic ions are implanted to the four sidewalls of each trench 8 by the method of the present invention under conditions of an accelerating energy of 80 keV, a dose of $2\times10^{14}$ cm$^{-2}$ and an implantation angle of 7°, thereby forming n+ regions 9. Thereafter, a polysilicon plate 11 is embedded interposing a dielectric film 10 of 10 nm thick, comprising, for example, $SiO_2/Si_3N_4/SiO_2$. A capacitor is thus formed in which the dielectric film 10 is held between the n+ region 9 and the polycrystalline electrode 11. Electrical characteristics of the n+-implanted layer 9 are evaluated on the basis of capacitance-voltage characteristics between the n+ region 9 and the polysilicon plate 11. As a result, the distribution of the voltage at a 6 inch wafer at which the node 9 in the capacitor turns vacant can be improved to be not more than 2% at 1 $\sigma$, compared with that in the prior art which is about 10%.

Processes of examples in which the present invention is applied in actual devices will be described below with reference to FIGS. 8 and 9.

Figure 8A:
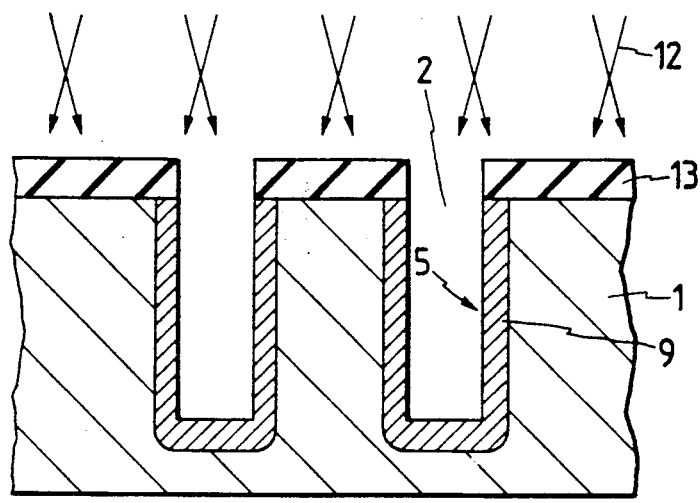
FIGS. 8A to 8C are cross sections of the steps of an example in which the present invention is applied in a dynamic RAM.
Figure 8B:
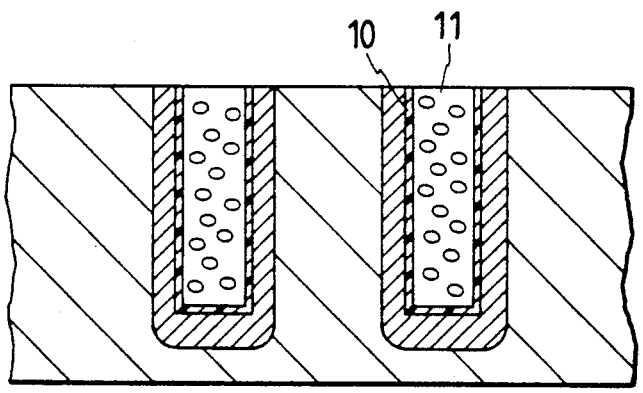
Figure 8C:
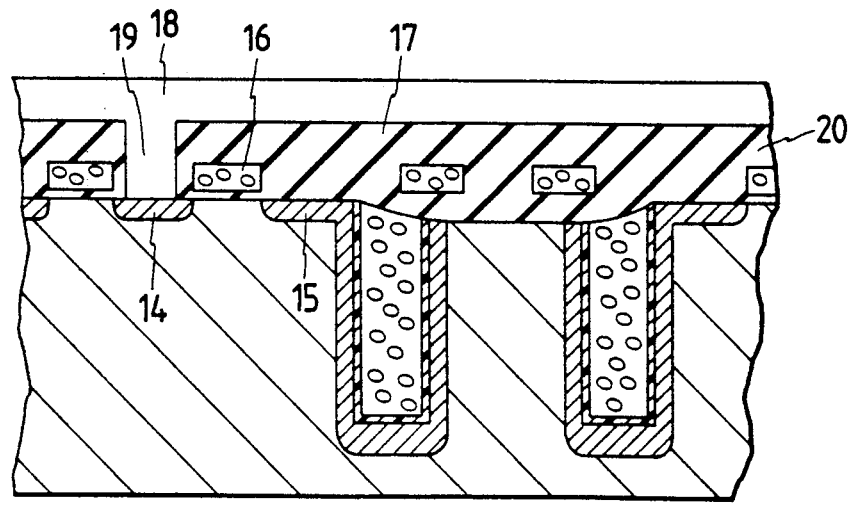

FIGS. 8A to 8C are cross sections of the steps of an example in which the capacitor as shown in FIG. 6 is used in a dynamic RAM (random-access memory). In the step in FIG. 8A, a deep trench 2 is formed in an oxide film 13 and a substrate 1, and an arsenic ion beam 12 is applied to sidewalls 5 of the trench 2 to carry out ion implantation according to the method of the present invention in which rotating ion implantation or intermittently rotating step ion implantation is used. An n+-doped layer 9 is thus formed. In the step in FIG. 8B, after a dielectric film 10 comprising, for example, $SiO_2/Si_3N_4/SiO_2$ has been formed, a polysilicone electrode 11 is formed by deposition. Thereafter, phosphorus is dispersedly incorporated into the polysilicone electrode 11, followed by etching to flat the surface. In the step in FIG. 8C, n+ layers 14 and 15 of a transfer gate, and a word line 16 are formed. A protective film 20 is formed, and then a contact area 19 is formed by etching. Thereafter, a bit line 18 is wired. A fundamental component part of a dynamic RAM is thus prepared.

The method of the present invention brings about an improvement in the uniformity of arsenic doping density at the sidewalls 5 of the trench 2 in the surface of a large-diameter wafer, so that the scattering of capacitance values of the dynamic RAM can be reduced, resulting in an increase in the yield of manufacture.

Figure 9A:
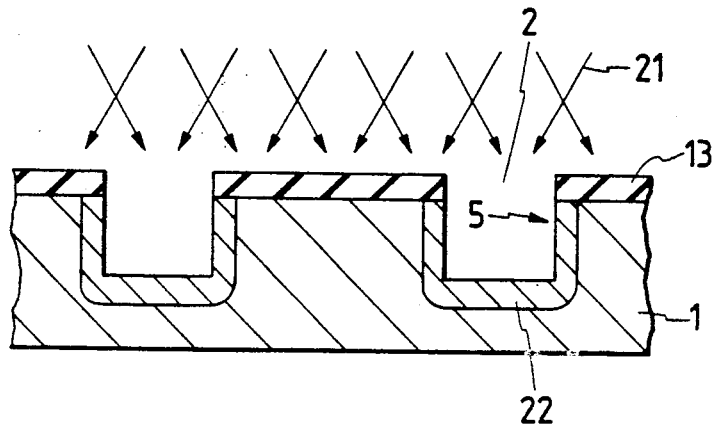
FIGS. 9A to 9C are cross sections of the steps of an example in which the present invention is applied in device isolation.
Figure 9B:
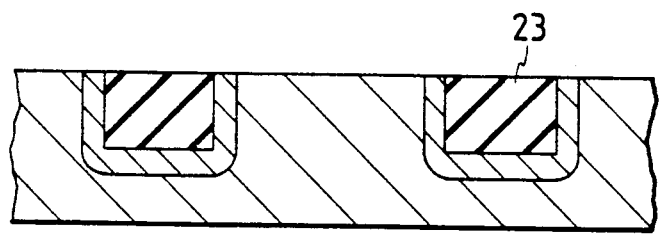
Figure 9C:
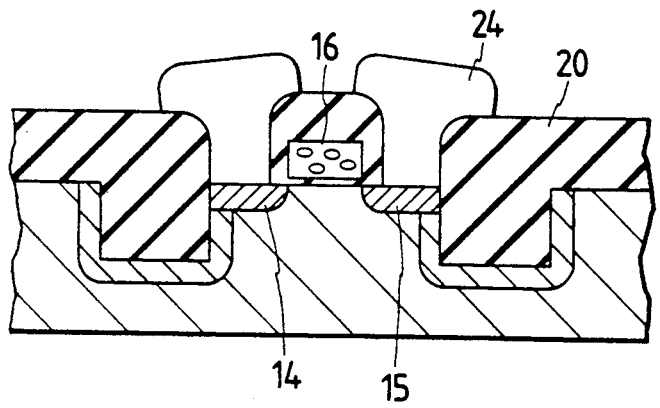

FIGS. 9A to 9C are cross sections of the steps of an example in which the present invention is applied in trench isolation. In the step in FIG. 9A, a relatively shallow trench 2 is formed in a substrate 1, and a boron ion beam 21 is shot to sidewalls 5 of the trench 2 to carry out ion implantation according to the method of the present invention in which rotating ion implantation or intermittently rotating step ion implantation is used. Thus a p+ layer is formed on a p− substrate 1. In the step in FIG. 9B, an $SiO_2$ film 13 is built up by LPCVD (low-pressure chemical vapor deposition). Then, the $SiO_2$ film is flatly embedded by an etchback process to give an isolation region 23. In the step in FIG. 9C, a gate 16, a source 14 and a drain 15 are formed, and thereafter a protective oxide film 20 is built up so that a source-drain contact area is formed. Then, electrode wiring 24 is formed, and n-MOS transistor is thus formed.

The method of the present invention brings about an improvement in the uniformity of boron doping density in the surface of a large-diameter wafer, so that the scattering of threshold voltage $V_T$ of the transistor, which is due to the narrow-channel effect, can be reduced.

In the embodiments described above, a silicon substrate is used as the semiconductor substrate. Needless to say, it is also possible to use a semiconductor of a GaAs or InP compound.

As will be clear from the foregoing descriptions, in the present invention the ion beam scanning velocity is varied depending on the scanning position on the wafer, whereby the doping density in trench sidewalls in the surface of a wafer can be improved.

What is claimed is:

1. An ion implantation method comprising doping a trench sidewall formed in the surface of a semiconductor substrate, with impurities by intermittently rotating step ion implantation carried out in the state that said sidewall is angled with respect to an ion beam, wherein;
the amount of ion implantation to said sidewall is made uniform by varying the scanning velocity of the ion beam on the surface of said semiconductor substrate, at the position near to, and the position distant from, the upstream side of the beam applied to a position at which said surface of semiconductor substrate is inclined with respect to the beam.

2. An ion implantation method according to claim 1, wherein said scanning velocity is varied in the manner that the scanning velocity of the beam at the position of $\theta+\alpha$ is varied in a ratio of $\sin(\theta+\alpha)/\sin\theta$, relative to the beam scanning velocity for the ions uniformly implanted to a plane at an angle of $\theta$, where $\theta$ is an ion implantation angle and $\alpha$ is an angle error produced when the beam scans the surface.

3. An ion implantation method according to claim 2, wherein the beam scanning velocity for the ions uniformly implanted at an angle of $\theta$ is a scanning velocity obtained by multiplying a scanning velocity correction coefficient for correcting reflection from a trench sidewall, depending on the implantation angle, and a scanning velocity correction coefficient for correcting a non-uniformity produced by beam spread.

4. A method of manufacturing a semiconductor device, comprising the steps of;
forming a trench in a semiconductor substrate by etching;
forming a doped layer on a sidewall of the trench thus formed, which is doped with impurities by intermittently rotating step ion implantation carried out with an angle between an ion beam and said sidewalls, while making uniform the amount of ion implantation to said sidewall by varying the scanning velocity of the ion beam on the surface of said semiconductor substrate, at the position near to, and the position distant from, the upstream side of the beam applied to a position at which said surface of semiconductor substrate is inclined with respect to the beam; and
forming a dielectric film on the surface of said doped layer, and embedding a polycrystalline film to form an electrode.

5. A method of manufacturing a semiconductor device according to claim 4, wherein said doped layer is formed on the trench sidewall by varying said scanning velocity in the manner that the scanning velocity of the beam at the position of $\theta+\alpha$ is varied in a ratio of $\sin(\theta+\alpha)/\sin\theta$, relative to the beam scanning velocity for the ions uniformly implanted to a plane at an angle of $\theta$, where $\theta$ is an ion implantation angle and $\alpha$ is an angle error produced when the beam scans the surface.

6. A method of manufacturing a semiconductor device according to claim 4, wherein the beam scanning velocity for the ions uniformly implanted at an angle of $\theta$ is a scanning velocity obtained by multiplying a scanning velocity correction coefficient for correcting reflection from a trench sidewall, depending on the implantation angle, and a scanning velocity correction coefficient for correcting a non-uniformity produced by beam spread.

7. A method of manufacturing a semiconductor device, comprising the steps of;
forming a trench in a semiconductor substrate;
forming a doped layer on a sidewall of the trench thus formed, which is doped with impurities by intermittently rotating step ion implantation carried out with an angle between an ion beam and said sidewalls, while making uniform the amount of ion implantation to said sidewall by varying the scanning velocity of the ion beam on the surface of said semiconductor substrate, at the position near to, and the position distant from, the upstream side of the beam applied to a position at which said surface of semiconductor substrate is inclined with respect to the beam; and
embedding a dielectric film in said trench to form a device isolation region.

8. A method of manufacturing a semiconductor device according to claim 7, wherein said scanning velocity is varied in the manner that the scanning velocity of the beam at the position of $\theta+\alpha$ is varied in a ratio of $\sin(\theta+\alpha)/\sin\theta$, relative to the beam scanning velocity for the ions uniformly implanted to a plane at an angle of $\theta$, where $\theta$ is an ion implantation angle and $\alpha$ is an angle error produced when the beam scans the surface.

9. A method of manufacturing a semiconductor device according to claim 7, wherein the beam scanning velocity for the ions uniformly implanted at an angle of $\theta$ is a scanning velocity obtained by multiplying a scanning velocity correction coefficient for correcting reflection from a trench sidewall, depending on the implantation angle, and a scanning velocity correction coefficient for correcting a non-uniformity produced by beam spread.

* * * * *